(12) United States Patent
Aoki et al.

(10) Patent No.: US 7,438,450 B2
(45) Date of Patent: Oct. 21, 2008

(54) SURFACE LIGHT SOURCE DEVICE AND LIQUID CRYSTAL DISPLAY ASSEMBLY

(75) Inventors: Tomio Aoki, Kanagawa (JP); Masayoshi Morita, Tokyo (JP)

(73) Assignee: Sony Corporation, Tokyo (JP)

( * ) Notice: Subject to any disclaimer, the term of this patent is extended or adjusted under 35 U.S.C. 154(b) by 0 days.

(21) Appl. No.: 11/807,573

(22) Filed: May 29, 2007

(65) Prior Publication Data
US 2007/0279930 A1    Dec. 6, 2007

(30) Foreign Application Priority Data
Jun. 2, 2006 (JP) .............................. 2006-155034

(51) Int. Cl.
*F21V 29/00* (2006.01)
(52) U.S. Cl. .................. 362/373; 362/218; 362/294; 362/600
(58) Field of Classification Search ................ 362/218, 362/294, 373, 600
See application file for complete search history.

(56) References Cited

U.S. PATENT DOCUMENTS

| | | | |
|---|---|---|---|
| 5,653,285 | A | 8/1997 | Lee |
| 6,650,215 | B1 | 11/2003 | Gundale |
| 2002/0167637 | A1 | 11/2002 | Burke et al. |
| 2004/0032725 | A1 * | 2/2004 | Hsieh et al. ............... 362/31 |
| 2006/0098457 | A1 * | 5/2006 | Chen et al. ............... 362/632 |
| 2006/0104067 | A1 * | 5/2006 | Hwang et al. ............ 362/373 |

FOREIGN PATENT DOCUMENTS

| | | |
|---|---|---|
| GB | 1150741 | 4/1969 |
| JP | 2006-59607 A | 3/2006 |

OTHER PUBLICATIONS

Nikkei Electronic, "Elimination of local color non uniformity by designing of dot printing pattern shape," Dec. 20, 2004, No. 889, pp. 128.

* cited by examiner

*Primary Examiner*—Sandra L. O'Shea
*Assistant Examiner*—Meghan K. Dunwiddie
(74) *Attorney, Agent, or Firm*—Wolf, Greenfield & Sacks, P.C.

(57) ABSTRACT

A liquid crystal display assembly includes a liquid crystal display, and a surface light source device that illuminates the liquid crystal display from a back surface. The surface light source device includes a housing including a bottom plate, a light source that is arranged on the bottom plate and illuminates the liquid crystal display, and a plurality of radiator fins arranged at a spacing from each other. Each of the radiator fins includes a first fin portion formed by bending a part of the bottom plate in a direction away from the liquid crystal display, the first fin portion extending substantially perpendicularly to the bottom plate, and a second fin portion formed by bending a part of the first fin portion in a direction away from the liquid crystal display, the second fin portion extending substantially parallel to the bottom plate.

4 Claims, 9 Drawing Sheets

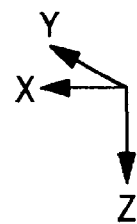
FIG. 3
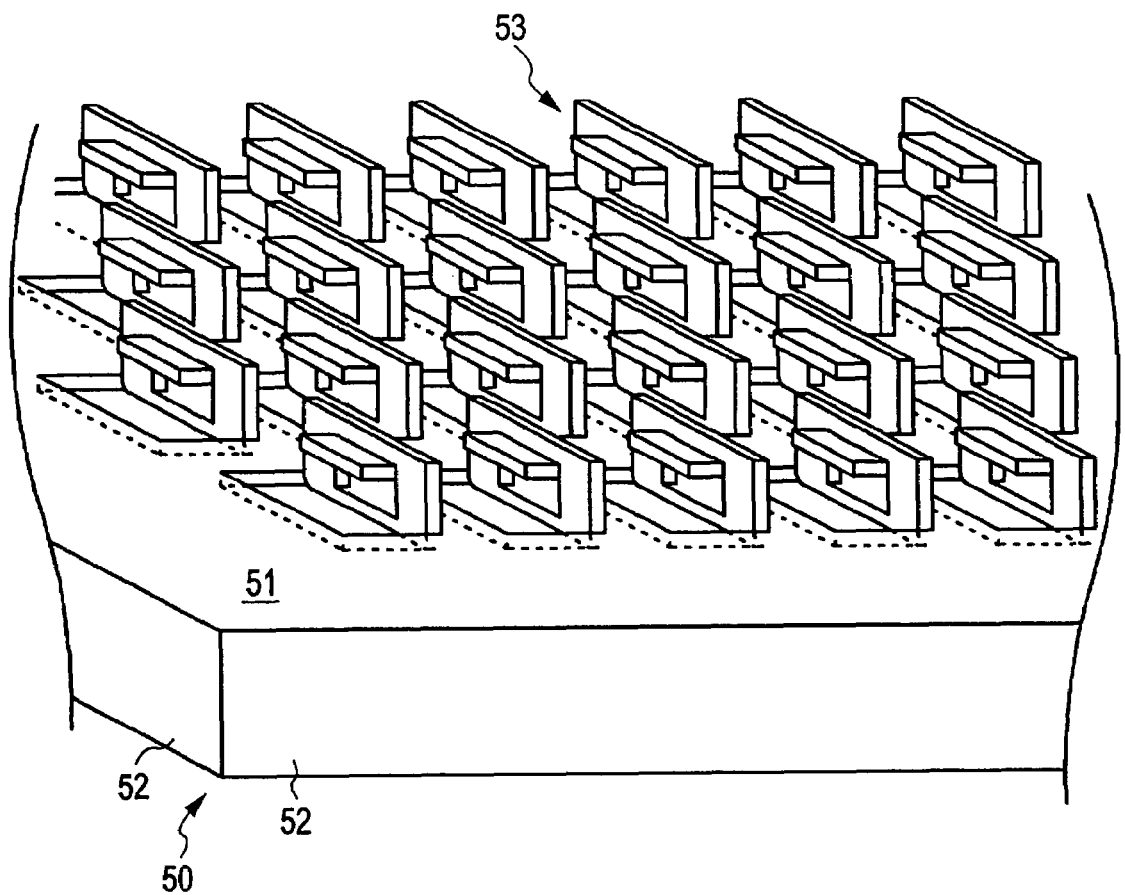

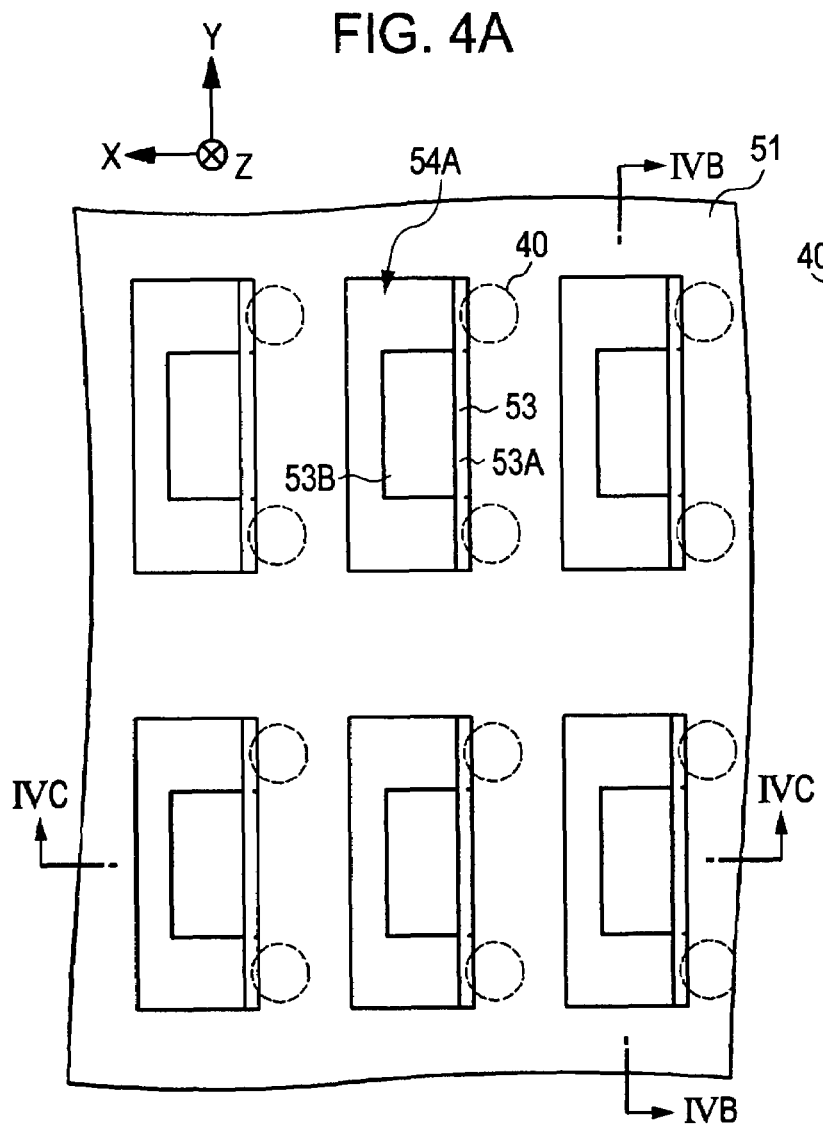
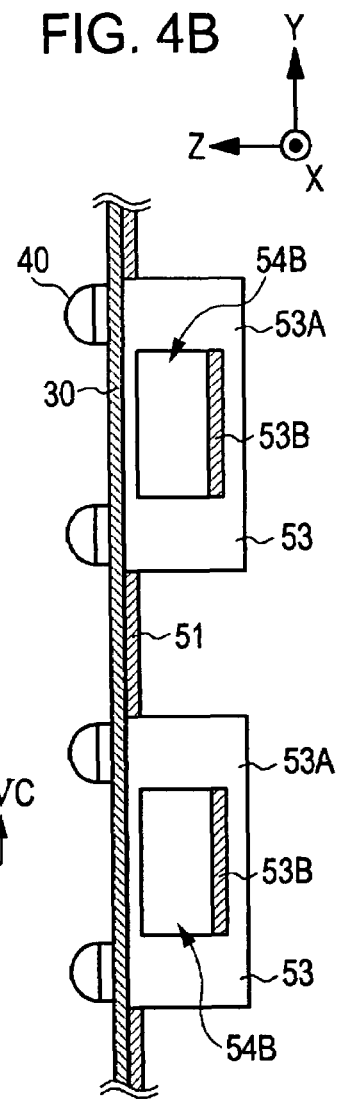
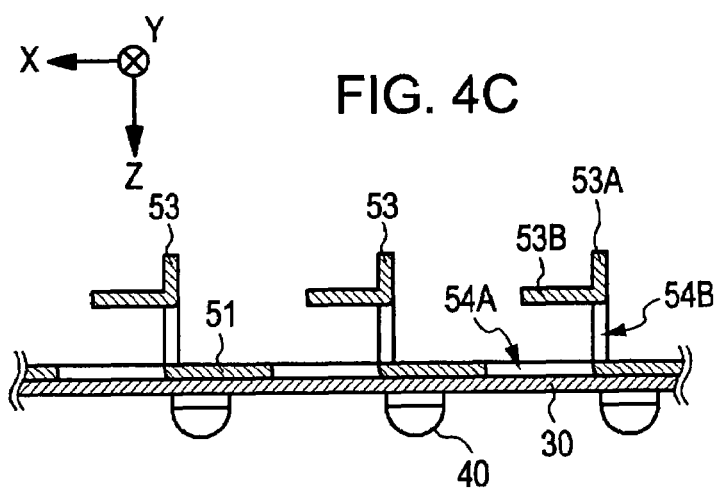

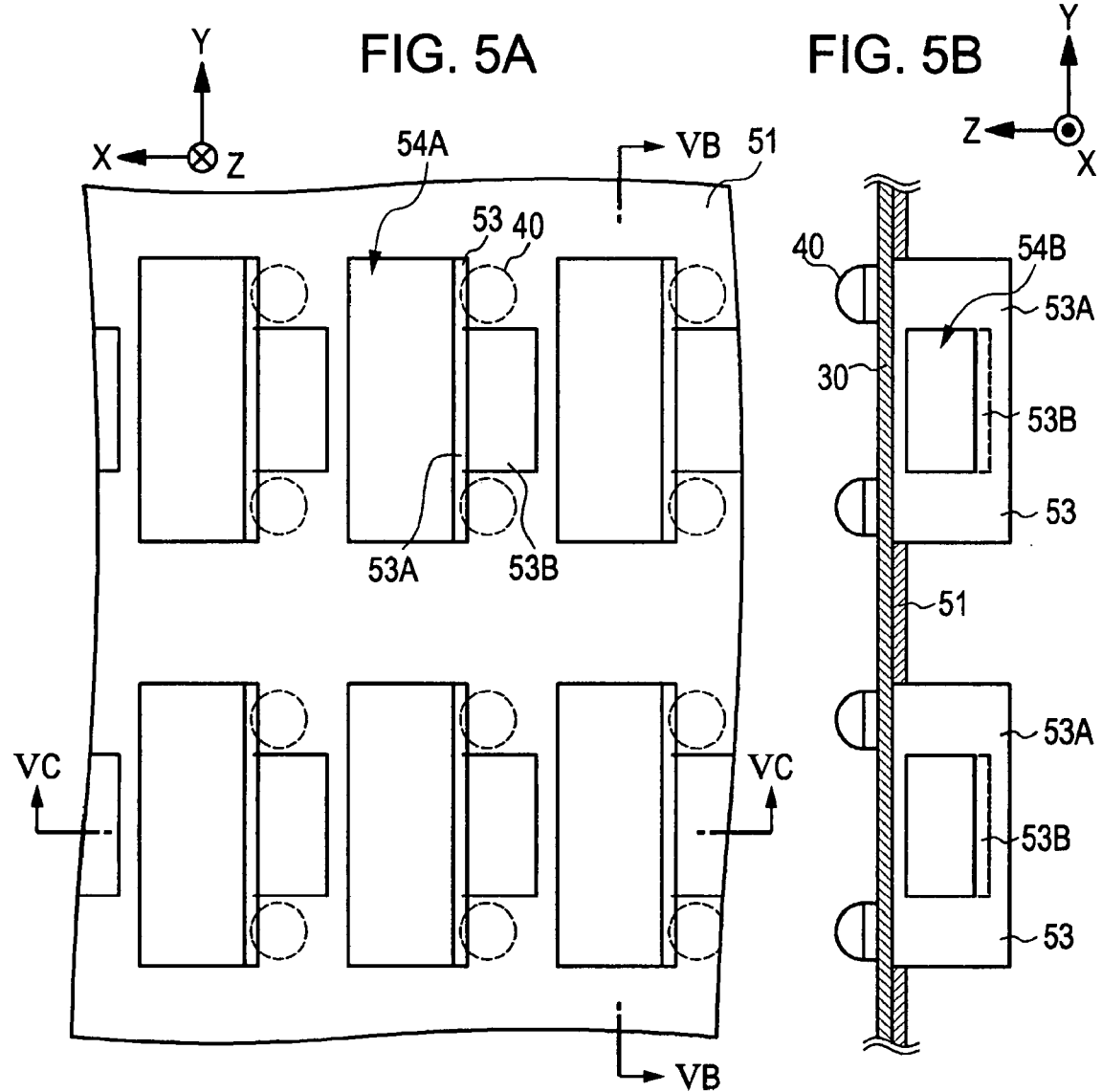
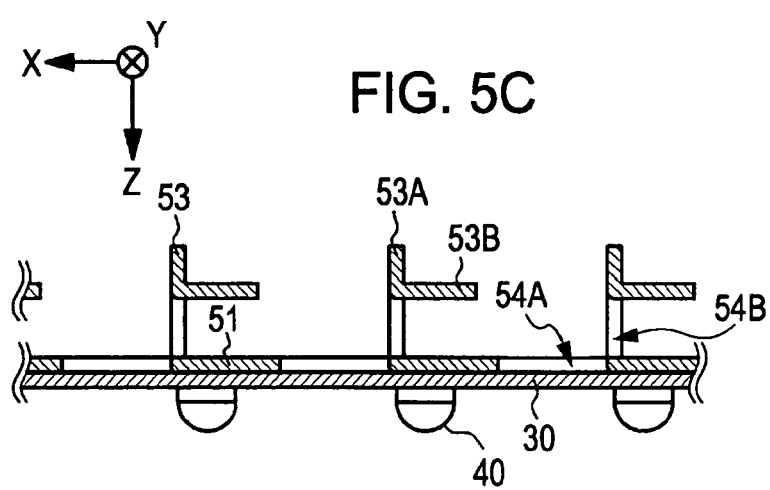

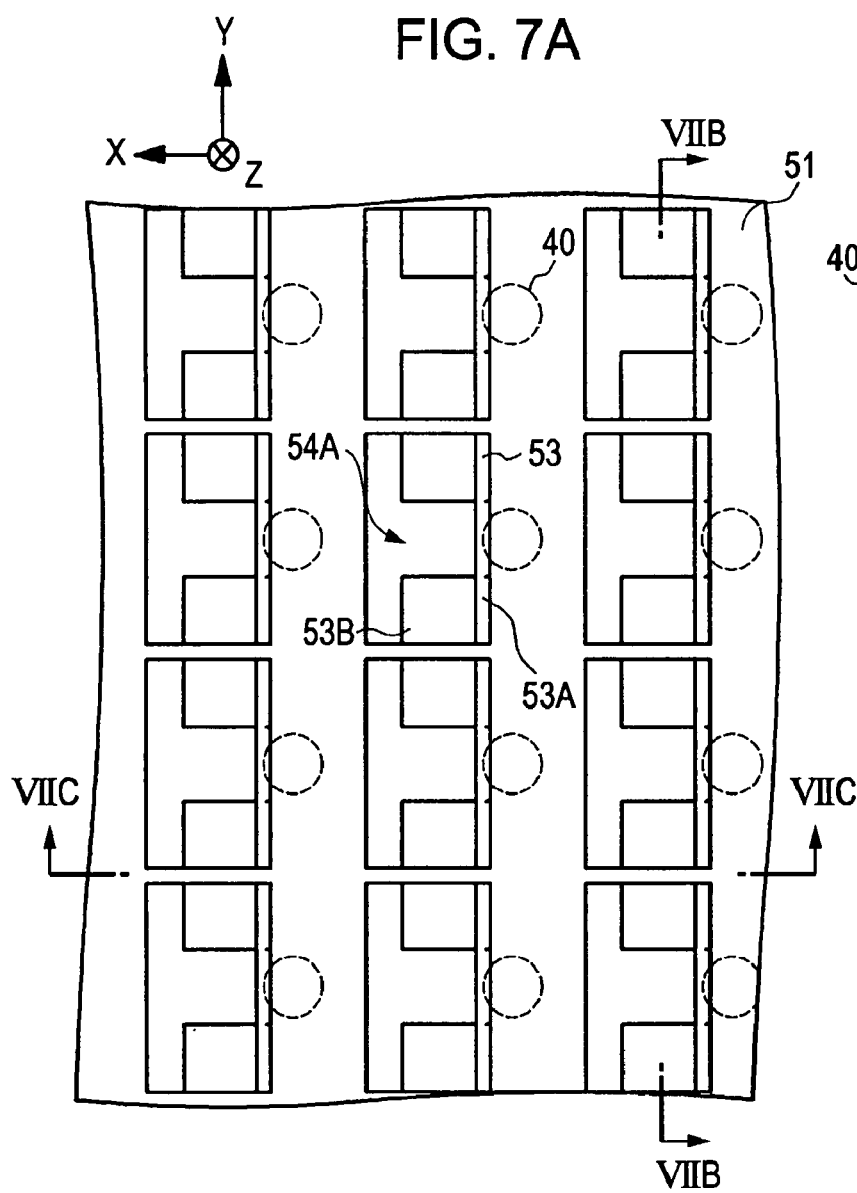
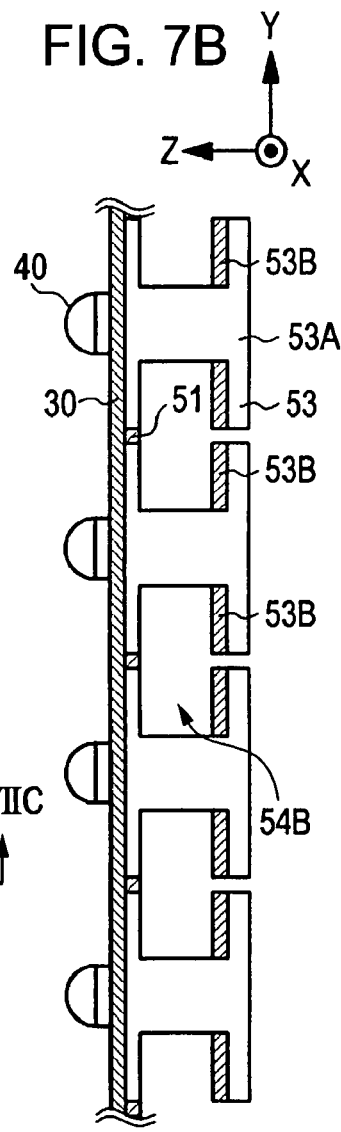
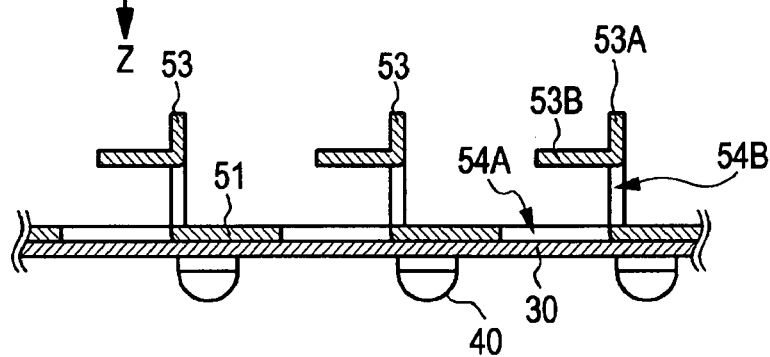

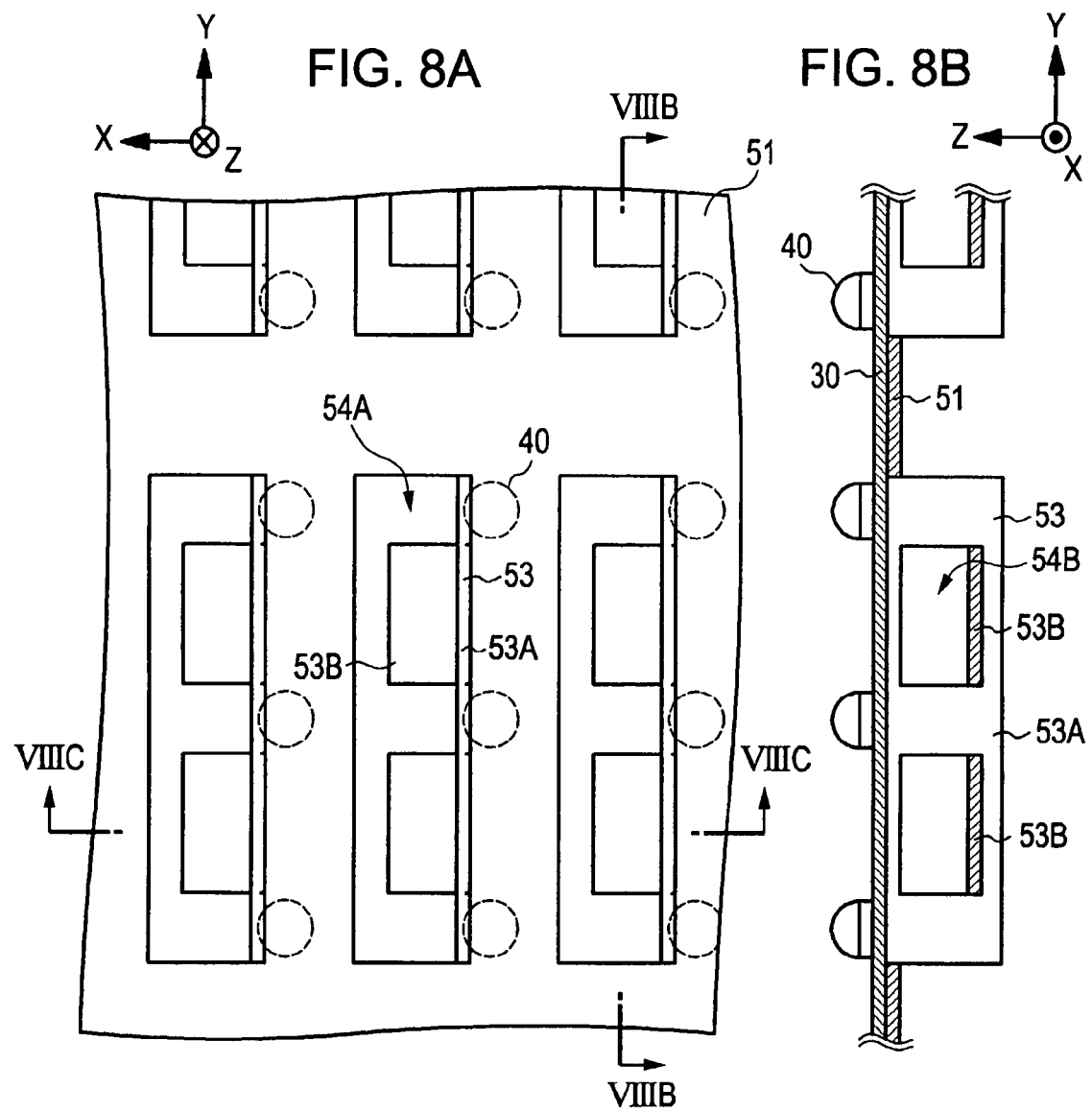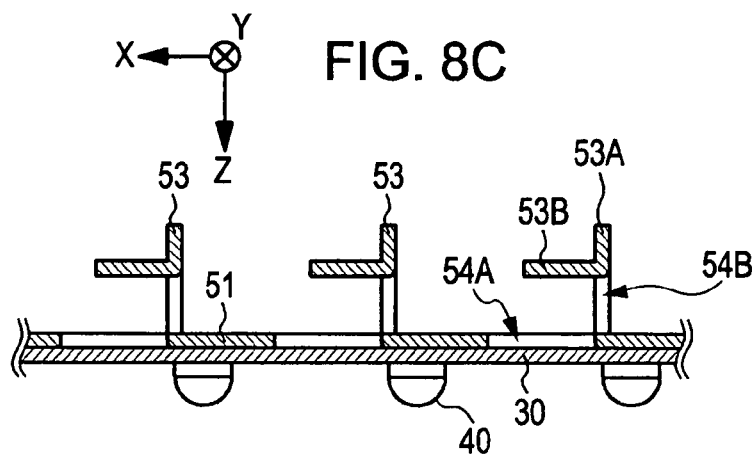

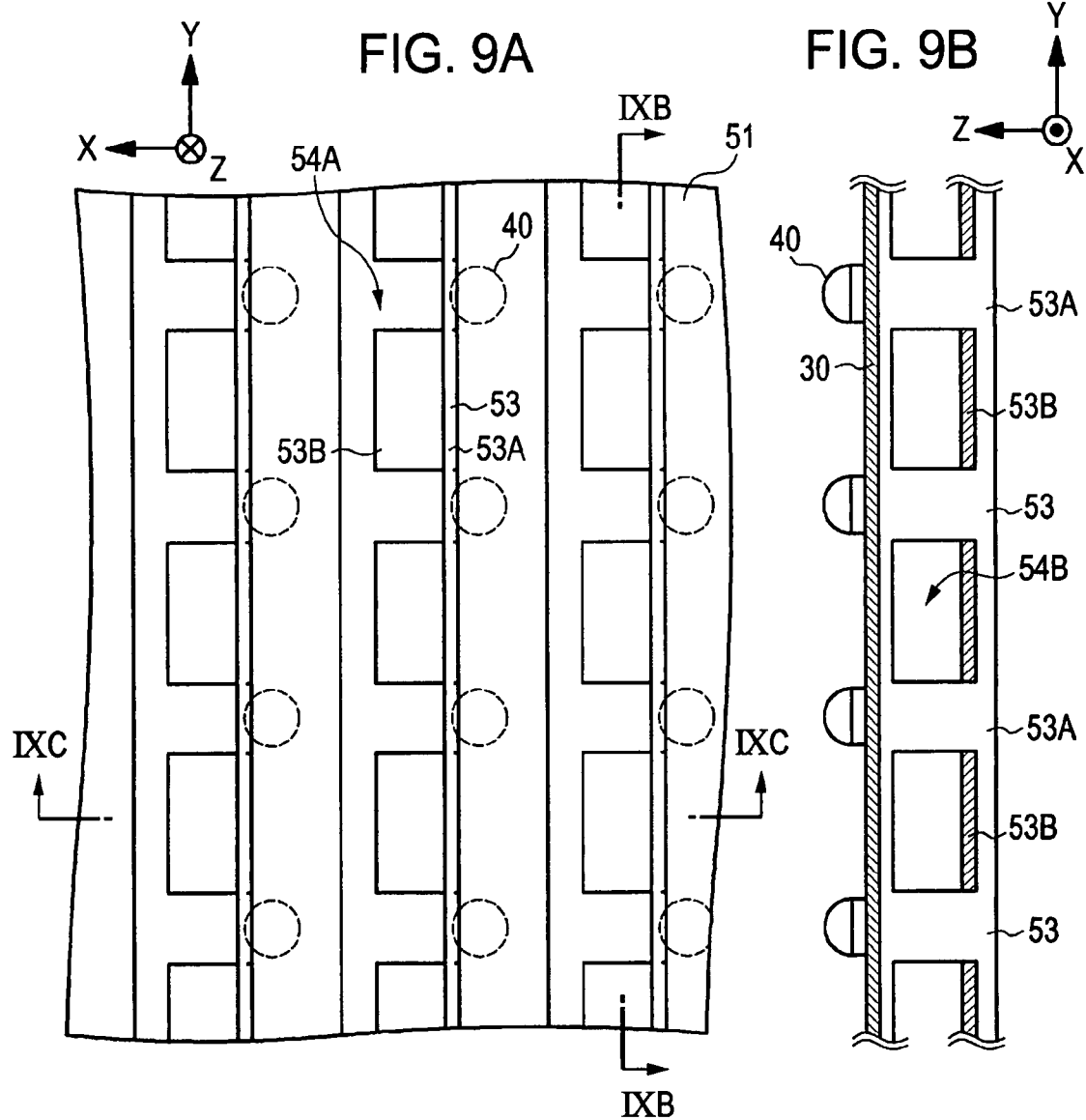

SURFACE LIGHT SOURCE DEVICE AND LIQUID CRYSTAL DISPLAY ASSEMBLY

CROSS REFERENCES TO RELATED APPLICATIONS

The present invention contains subject matter related to Japanese Patent Application JP 2006-155034 filed in the Japanese Patent Office on Jun. 2, 2006, the entire contents of which are incorporated herein by reference.

BACKGROUND OF THE INVENTION

1. Field of the Invention

The present invention relates to a surface light source device and a liquid crystal display assembly.

2. Description of the Related Art

In a liquid crystal display, liquid crystal itself does not emit light. Thus, for example, a so-called direct-type surface light source device (backlight) that radiates light to a liquid crystal display is arranged on the back surface of the liquid crystal display. By causing liquid crystal cells constituting each pixel to operate as a kind of optical shutter (light valve), that is, by controlling the light transmittance of each pixel, the optical transmittance of light (for example, white light) emitted from the surface light source device is controlled, thus displaying an image. As liquid crystal displays are becoming larger, surface light source devices (backlights) are also becoming larger.

Some degree of heat generation is inevitable during the operation of a light source constituting a surface light source device. Therefore, as the surface light source device operates, its temperature rises. When heat radiation for the surface light source device (in other words, heat radiation for the light source constituting the surface light source device) is not sufficient, the temperature of the light source rises, which causes various problems. For instance, when a light emitting diode (LED) is used as the light source, the efficiency of light emission decreases as the temperature of the light source rises. Therefore, in the case of a surface light source device having a plurality of light sources arranged therein, luminance or color variations occur as the temperature distribution becomes non-uniform in the surface light source device. Such luminance or color variations of the surface light source device cause a deterioration in the image quality of the liquid crystal display. Further, operating a light source under high temperature conditions is a cause of accelerated degradation of the light source. In view of this, various heat radiation measures have been proposed in the related art. For example, Japanese Unexamined Patent Application Publication No. 2006-59607 discloses a surface light source device in which a light source is arranged on a radiator plate to which a heat pipe and a heat sink are attached, and a cooling fan for promoting heat radiation of the heat sink is provided.

SUMMARY OF THE INVENTION

According to the structure of the related art, the heat pipe and the heat sink are attached to the surface light source device as independent components. This adds complexity to the structure of the surface light source device, leading to an increase in cost.

Accordingly, it is desirable to provide a liquid crystal display assembly of superior image quality which includes a surface light source device that can provide favorable heat radiation characteristics at low cost. Further, it is also desirable to provide a surface light source device that can provide favorable heat radiation characteristics at low cost and suppress luminance or color variations.

A liquid crystal display assembly according to an embodiment of the present invention relates to a liquid crystal display assembly including: (a) a liquid crystal display; and (b) a surface light source device that illuminates the liquid crystal display from a back surface.

A surface light source device according to an embodiment of the present invention relates to a surface light source device that illuminates a liquid crystal display from a back surface.

Further, each of the above-mentioned surface light source device constituting the above-mentioned liquid crystal display assembly according to an embodiment of the present invention, and the above-mentioned surface light source device according to an embodiment of the present invention includes (A) a housing including a bottom plate, (B) a light source that is arranged on the bottom plate and illuminates the liquid crystal display, and (C) a plurality of radiator fins arranged at a spacing from each other. Each of the radiator fins includes (C-1) a first fin portion formed by bending a part of the bottom plate in a direction away from the liquid crystal display, the first fin portion extending substantially perpendicularly to the bottom plate, and (C-2) a second fin portion formed by bending a part of the first fin portion in a direction away from the liquid crystal display, the second fin portion extending substantially parallel to the bottom plate.

As described above, the surface light source device constituting the liquid crystal display assembly according to an embodiment of the present invention, and the surface light source device according to an embodiment of the present invention includes a housing including a bottom plate, a light source that is arranged on the bottom plate and illuminates the liquid crystal display, and a plurality of radiator fins arranged at a spacing from each other. Further, each of the radiator fins includes a first fin portion formed by bending a part of the bottom plate in a direction away from the liquid crystal display, the first fin extending substantially perpendicularly to the bottom plate, and a second fin portion formed by bending a part of the first fin portion in a direction away from the liquid crystal display, the second fin portion extending substantially parallel to the bottom plate. Since the radiator fins are thus formed integrally with the bottom plate constituting the housing, there is no need to attach the radiator fins to the housing and the like as independent components. Further, since the second fin portion is formed by bending a part of the first fin portion in a direction away from the liquid crystal display, an opening corresponding to the second fin portion is formed in the first fin portion. Since the radiator fins are arranged at a spacing from each other, and the above-described opening is formed in the first fin portion, in each of the radiator fins, a passage for air is secured in both a direction parallel to the first fin portion (for example, the Y direction), and a direction perpendicular to the first fin portion (for example, the X direction), thereby achieving an improvement in cooling efficiency. Further, the second fin portion is formed by bending a part of the first fin portion in a direction away from the liquid crystal display (that is, in a direction away from the light source). Since the environmental temperature qualitatively decreases with increasing distance from a heat generation source, the second fin portion is placed under a lower temperature environment, thus achieving an improvement in cooling efficiency. Therefore, the use of the radiator fins configured as described above makes it possible to obtain favorable heat radiation characteristics at low cost. It suffices that the first fin portion extend substantially perpendicularly to the bottom plate, and may not extend strictly perpendicularly. Likewise, it suffices that the second fin portion extend substantially parallel to the bottom plate, and may not extend strictly parallel. One or a plurality of second fin portions may be formed in the first fin portion. The bending direction of the second fin portion with respect to the first fin portion is not particularly limited, and may be arbitrarily selected in accordance with the structure of the radiator fins. Although a wide range of known materials may be used as the material forming the bottom plate that constitutes the housing, qualitatively speaking, the bottom plate is preferably formed of a material of high thermal conductivity. For example, the bottom plate can be formed of a metallic material such as aluminum, copper, and stainless steel. In the case where a metallic material is used, the radiator fins can be readily formed by a known press working method or the like.

In the surface light source device constituting the liquid crystal display assembly according to an embodiment of the present invention, and the surface light source device according to an embodiment of the present invention (hereinafter, these will often be generically referred to as "the surface light source device according to an embodiment of the present invention") including the various preferred modes and configurations as described above, the light source that illuminates the liquid crystal display is arranged on the bottom plate. The light source may either be directly attached to the bottom plate or indirectly attached to the bottom plate via another component. For example, a configuration can be adopted in which the light source is attached onto a plate-shaped member formed of a metallic material such as aluminum, copper, or stainless steel, and this plate-shaped member is fixed onto the bottom plate. The number of light sources may be selected as appropriate in accordance with the size, structure, and the like of the surface light source device. In a configuration where a plurality of light sources are arranged, the plurality of light sources are arranged at a spacing from each other, with each light source being arranged at the boundary between the first fin portion and the bottom plate (more specifically, in the portion of the bottom plate at the boundary between the first fin portion and the bottom plate or in the vicinity of the boundary). In this case, either all or some of the bottom surfaces of the respective light sources (that is, the surfaces on the radiator fin side) may face the bottom plate. By adopting the configuration in which each light source is arranged at the boundary between the first fin portion and the bottom plate, heat generated by each light source is efficiently transmitted to the first fin portion, thereby enabling efficient cooling of the light source.

In the surface light source device according to an embodiment of the present invention including the various preferred modes and configurations as described above, a configuration may be adopted in which a cover surrounding a plurality of radiator fins is arranged so as to face the bottom plate, a vent hole and a blower-means opening are formed in the cover, and blower means is arranged in the opening. The shape and the like of the blower-means opening may be set as appropriate in accordance with the design of the cover. The blower-means opening may be formed by a single opening or may be formed by a plurality of openings. For example, when the blower means is arranged in an area where a plurality of vent holes are provided, the plurality of vent holes provided in the area corresponding to the blower means each constitute the blower-means opening. The direction of air blow by the blower means is not particularly limited. The vent hole may be arranged as appropriate in accordance with the size, structure, temperature distribution, and the like of the surface light source device. A wide range of known means, such as a single blower fan and a combination of a blower fan and a duct, may be used the blower means. Qualitatively speaking, the flow rate of air tends to decrease with increasing distance from the blower means such as a blower fan. Therefore, the number of vent holes formed per unit surface area of the cover may be changed in accordance with the distance from the blower means. This makes it possible to make the temperature distribution in the surface light source device uniform. Qualitatively speaking, the vent holes may be formed densely in areas far from the blower means, and may be formed sparsely in areas closer to the blower means. A wide range of known materials, such as a metallic material and a synthetic resin material, can be used as the material forming the cover. For example, in the case of forming the cover from a metallic material, the vent hole and the opening can be formed by a known press working method or the like. Further, in the case of forming the cover from a synthetic resin material, the vent hole or the opening can be formed by injection molding. It should be noted that the above-mentioned cover may also serve as an exterior housing of the liquid crystal display assembly. For example, the above-mentioned cover may also serve as an exterior back cover of the liquid crystal display assembly.

In the liquid crystal display assembly according to an embodiment of the present invention, and the surface light source device according to an embodiment of the present invention (hereinafter, these will often be generically referred to as "the present invention") including the various preferred modes and configurations as described above, a light guide plate serving as a light guide may be arranged between the light source and the liquid crystal display. As for the material forming the light guide plate, the light guide plate is preferably prepared from a material that is transparent with respect to light from the light source, that is, a material that does not absorb light emitted from the light source very much. Specific examples of the material forming the light guide plate include glass, and a plastic material (for example, PMMA, polycarbonate resin, acrylic resin, amorphous polypropylene resin, and styrene resin including AS resin). A light diffusing surface or light reflecting surface may be provided in the light guide plate. The surface of the light guide plate facing the light source may be provided with a recess to make light from the light source enter the light guide plate at a suitable angle. Examples of the shape of the recess include various smooth curved surfaces, such as a pyramid, a circular cone, a circular cylinder, a polygonal column such as a triangular column and a square column, a part of a sphere, a part of a spheroid, a part of a paraboloid, and a part of a hyperboloid. The light guide plate may be formed by a single component or a plurality of components arranged in the form of tiles, for example.

According to the present invention, a wide range of known light sources, such as a cold-cathode fluorescent lamp, and a light emitting diode (LED), can be used as the light source constituting the surface light source device. The shape of the fluorescent lamp may be determined on the basis of the specifications required for the fluorescent lamp. Examples of such a shape include a linear (straight tube) shape, a "U" shape, a continuous "U" shape, an "S" shape, a continuous "S" shape, and a "W" shape. Further, provided that the luminescent color of the surface light source device is white, the light source may be formed from a fluorescent lamp coated with a white phosphor, a light emitting diode group including a white light emitting diode (for example, a light emitting diode which emits white light in combination with an ultraviolet or violet light emitting diode and phosphor particles), a red light emitting diode which emits red light (with a wavelength of, for example, 640 nm), a green light emitting diode which emits green light (with a wavelength of, for example, 530 nm), and a blue light emitting diode which emits blue light (with a wavelength of, for example, 450 nm), or the like. It should be noted that a light emitting diode which emits light of a fourth color other than red, green, and blue may be further provided. Since a light source formed by a light emitting diode occupies a small volume, the use of such a light source is suitable for cases where a plurality of light sources are to be arranged. There are no particular limitations on the driving conditions for the light source. For example, it is possible to adopt a configuration in which all the light sources constantly emit light under fixed driving conditions, or a configuration in which the light-emitting surface of the surface light source device is divided into a plurality of areas, and the amount of light emission corresponding to each of the areas is individually controlled.

The light emitting diode constituting the light source may have a so-called face up structure or may have a flip-chip structure. That is, it is possible to adopt a structure in which the light emitting diode is formed by a substrate and a light emitting layer formed on the substrate, and light is emitted to the outside from the light emitting layer, or a structure in which light from the light emitting layer passes through the substrate to be emitted to the outside. More specifically, the light emitting diode (LED) has a laminate structure including a first clad layer, which is formed on the substrate and made of a compound semiconductor layer having a first conductivity type (for example, n-type), an active layer formed on the first clad layer, and a second clad layer, which is formed on the first clad layer and made of a compound semiconductor layer having a second conductivity type (for example, p-type), and also includes a first electrode electrically connected to the first clad layer, and a second electrode electrically connected to the second clad layer. The layers forming the light emitting diode may be formed from known compound semiconductor materials depending on the luminous wavelength. As in the Lambert Cyan type, a lens with a high light intensity in the rectilinear direction may be attached to the light emitting portion of the light emitting diode. Alternatively, it is possible to adopt a two-dimensional emission configuration in which, using a light-emitting diode assembly having a light extraction lens attached to a light emitting diode, light emitted from the light emitting diode undergoes total reflection by the top face of the light extraction lens to be mainly emitted in the horizontal direction of the light extraction lens. Such a configuration is disclosed in, for example, Nikkei Electronics, page 128, Vol. 889, Dec. 20, 2004.

According to the present invention, light from the surface light source device may be radiated via: a diffuser plate; an optical functional sheet group including a diffuser sheet, a prism sheet, and a polarization conversion sheet; a reflection sheet, or the like. A wide range of known materials may be used for the diffuser plate, the diffuser sheet, the prism sheet, the polarization conversion sheet, or the reflection sheet. The optical functional sheet group may be formed by various sheets arranged at a spacing from each other, or may be formed as integral laminated sheets. For example, the diffuser sheet, the prism sheet, the polarization sheet, and the like may be laminated to form an integral structure.

The liquid crystal display used in an embodiment of the present invention may be a monochrome liquid crystal display or a color liquid crystal display. Such a color liquid crystal display is formed by, for example, a front panel including a first transparent electrode, a rear panel including a second transparent electrode, and a liquid crystal material arranged between the front panel and the rear panel.

Here, more specifically, the front panel is formed by, for example, a first substrate made of a glass substrate or a silicon substrate, a first transparent electrode (also called a common electrode and made of, for example, ITO) provided on the inner surface of the first substrate, and a polarization film provided on the outer surface of the first substrate. Further, in the case of a color liquid crystal display, the front panel has a structure in which a color filter coated with an overcoat layer made of acrylic resin or epoxy resin is provided on the inner surface of the first substrate, and the first transparent electrode is formed on the overcoat layer. An alignment layer is formed on the first transparent electrode. Examples of the arrangement pattern of the color filter include a delta arrangement, a stripe arrangement, a diagonal arrangement, and a rectangle arrangement. On the other hand, more specifically, the rear panel is formed by, for example, a second substrate made of a glass substrate or a silicon substrate, a switching element formed on the inner surface of the second substrate, a second transparent electrode (also called a pixel electrode and made of, for example, ITO) whose conduction/non-conduction is controlled by the switching element, and a polarization film provided on the outer surface of the second substrate. An alignment layer is formed on the entire surface including the second transparent electrode. These various components and liquid crystal materials constituting a transmission type color liquid crystal display can be formed by known components and materials. Examples of the switching element include a three-terminal element such as an MOS type FET or a thin film transistor (TFT), or a two-terminal element such as an MIM element, a varistor element, or a diode formed on a single-crystal silicon semiconductor substrate.

It should be noted that an area where the first transparent electrode and the second transparent electrode overlap and which includes a liquid crystal cell corresponds to one sub pixel. Further, a red-light-emitting sub pixel constituting each pixel is formed by a combination of the above-mentioned area and a color filter, and a green-light-emitting sub pixel is formed by a combination of the above-mentioned area and a color filter, and a blue-light-emitting sub pixel is formed by a combination of the above-mentioned area and a color filter. The arrangement pattern of the red-light-emitting sub pixel, green-light-emitting sub pixel, and blue-light-emitting sub pixel coincides with the arrangement pattern of the color filter mentioned above.

When the number $M_0 \times N_0$ of pixels arranged in a two-dimensional matrix is given as $(M_0, N_0)$, several resolutions for image display, such as VGA (640, 480), S-VGA (800, 600), XGA (1024, 768), APRC (1152, 900), S-XGA (1280, 1024), U-XGA (1600, 1200), HD-TV (1920, 1080), and Q-XGA (2048, 1536), and also (1920, 1035), (720, 480), (1280, 960), and the like can be exemplified as the specific value of $(M_0, N_0)$. However, the value of $(M_0, N_0)$ is not limited to these values.

Examples of the driving circuit for driving the liquid crystal display and the surface light source device include a surface-light-source-device controlling circuit formed by, for example, a pulse width modulation (PWM) signal generating circuit, a duty ratio controlling circuit, a light-emitting-diode (LED) driving circuit, an arithmetic circuit, a memory, or the like, and a liquid-crystal-display driving circuit formed by a known circuit such as a timing controller. It should be noted that the number of pieces of image information (images-per-second) sent to the driving circuit as electrical signals within one second is the frame frequency (frame rate), and the inverse of the frame frequency is the frame time (unit: second).

In the surface light source device constituting the liquid crystal display assembly according to an embodiment of the present invention, and the surface light source device according to an embodiment of the present invention, the radiator fins are formed integrally with the bottom plate constituting the housing, and hence there is no need to attach the radiator fins to the housing or the like as independent components. Further, a passage for air is secured in both of the directions parallel to and perpendicular to the first fin portion, thereby achieving an improvement in cooling efficiency. Furthermore, since the second fin portion is formed by bending a part of the first fin portion in a direction away from the liquid crystal display, the second fin portion can be arranged on the lower temperature side. It is thus possible to obtain a liquid crystal display assembly including a surface light source device that can provide favorable heat radiation characteristics at low cost, and a surface light source device that can provide favorable heat radiation characteristics at low cost and suppress luminance or color variations.

BRIEF DESCRIPTION OF THE DRAWINGS

FIG. 3 is a schematic perspective view of a part of a housing in which radiator fins are formed;

FIG. 4A is a schematic plan view of a part of a bottom plate of a housing, FIG. 4B is a schematic sectional view taken along the direction of the arrow IVB of FIG. 4A, and FIG. 4C is a schematic sectional view taken along the direction of the arrow IVC of FIG. 4A;

FIG. 5A is a schematic plan view of a part of a bottom plate of a housing according to a first modification, FIG. 5B is a schematic sectional view taken along the direction of the arrow VB of FIG. 5A, and FIG. 5C is a schematic sectional view taken along the direction of the arrow VC of FIG. 5A;

FIG. 7A is a schematic plan view of a part of a bottom plate of a housing according to a second modification, FIG. 7B is a schematic sectional view taken along the direction of the arrow VIIB of FIG. 7A, and FIG. 7C is a schematic sectional view taken along the direction of the arrow VIIC of FIG. 7A;

FIG. 8A is a schematic plan view of a part of a bottom plate of a housing according to a second modification, FIG. 8B is a schematic sectional view taken along the direction of the arrow VIIIB of FIG. 8A, and FIG. 8C is a schematic sectional view taken along the direction of the arrow VIIIC of FIG. 8A; and FIG. 9A is a schematic plan view of a part of a bottom plate of a housing according to a second modification, FIG. 9B is a schematic sectional view taken along the direction of the arrow IXB of FIG. 9A, and FIG. 9C is a schematic sectional view taken along the direction of the arrow IXC of FIG. 9A.

DESCRIPTION OF THE PREFERRED EMBODIMENTS

The present invention will now be described by way of its embodiments with reference to the drawings.

An embodiment of the present invention relates to a liquid crystal display assembly and a surface light source device.

Figure 1A:
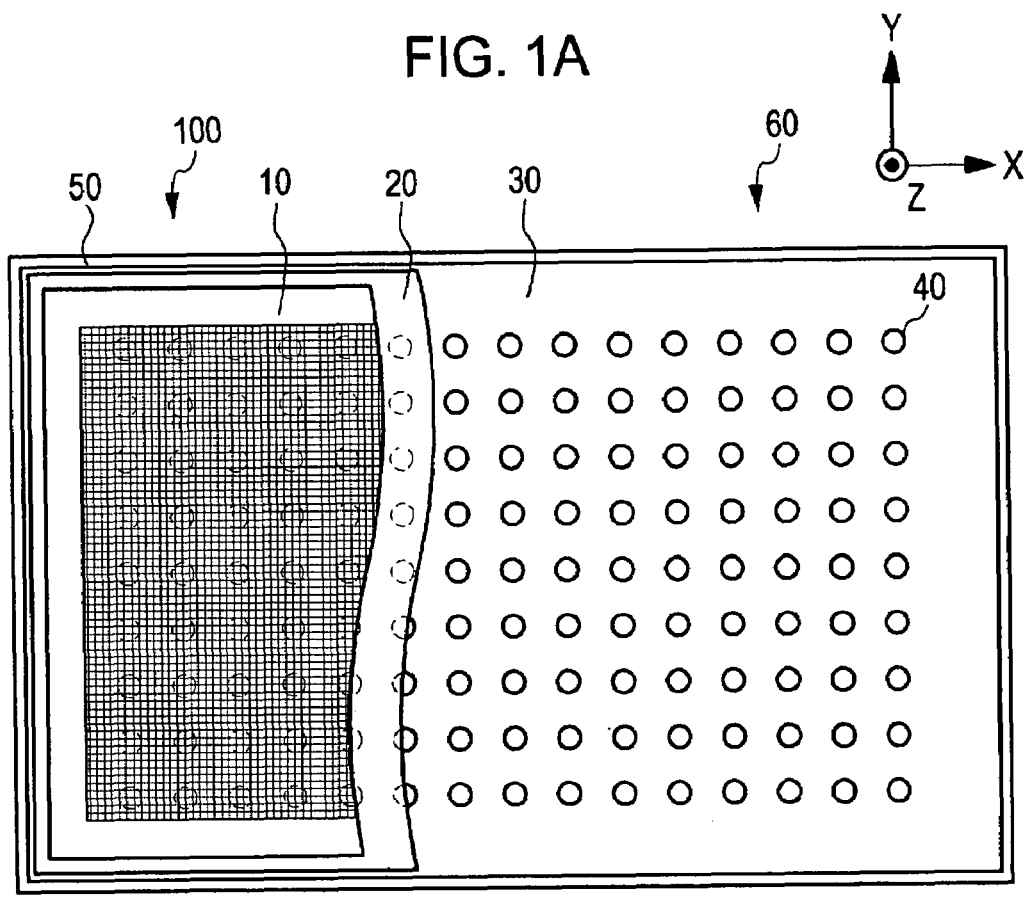
FIG. 1A is a schematic conceptual view of a liquid crystal display assembly and a surface light source device according to an embodiment of the present invention.
Figure 1B:
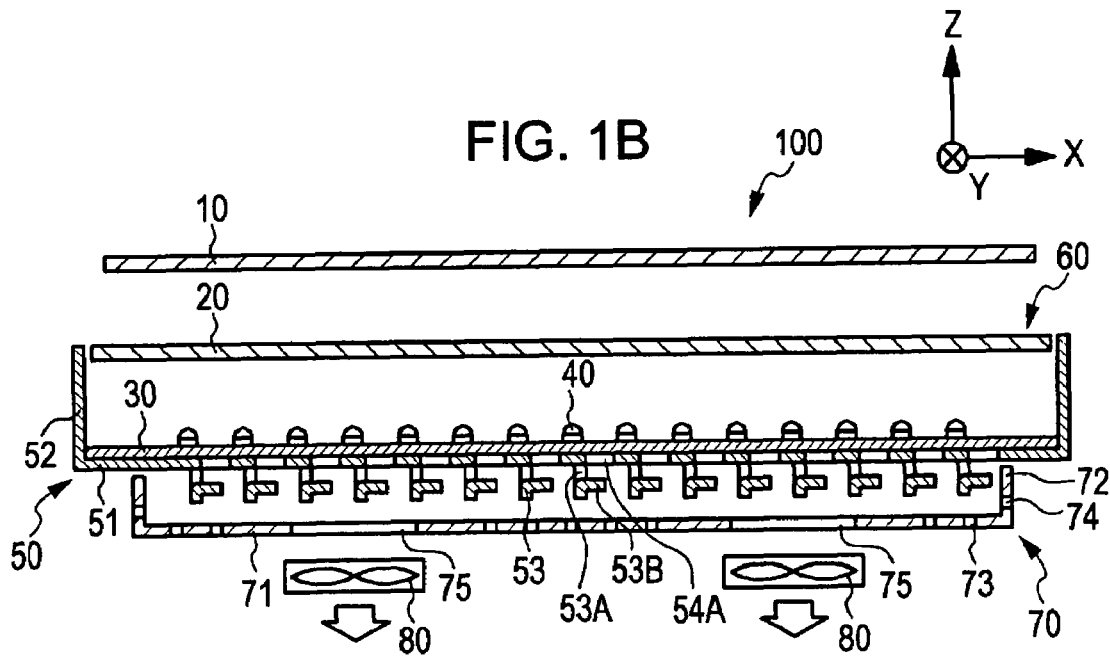
FIG. 1B is a schematic view, partly in portion, of a liquid crystal display assembly and a surface light source device according to an embodiment of the present invention.
Figure 2:
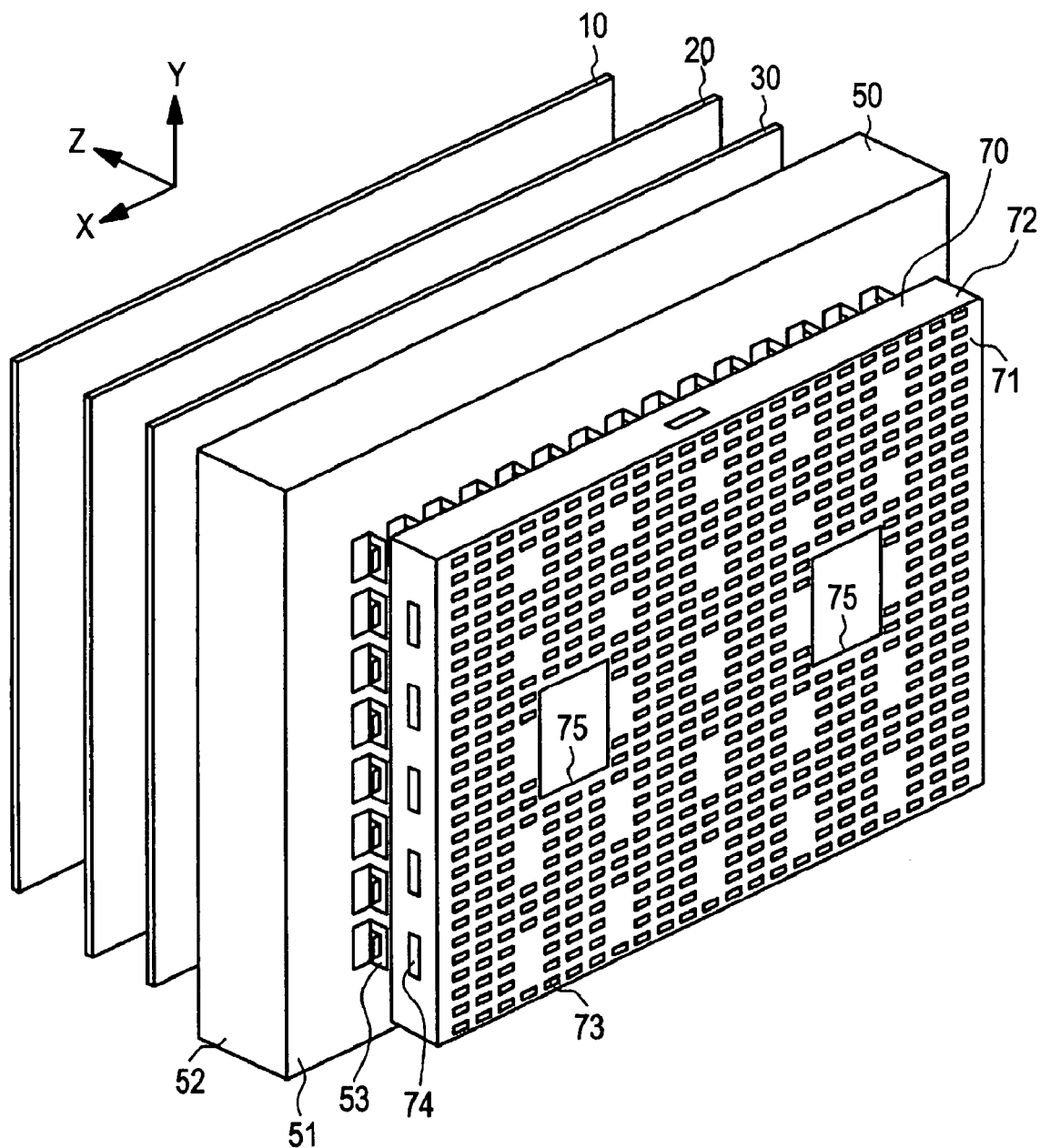
FIG. 2 is a schematic exploded perspective view of a liquid crystal display assembly and a surface light source device.

FIG. 1A is a schematic conceptual view of a liquid crystal display assembly 100 and a surface light source device 60 according to this embodiment. FIG. 1B is a schematic view, partly in section, of the liquid crystal display assembly 100 and the surface light source device 60 according to this embodiment. In FIG. 1B, the hatching of the liquid crystal display 10 and a diffuser plate 20 is omitted. FIG. 2 is a schematic exploded perspective view of the liquid crystal display assembly 100 and the surface light source device 60. In FIG. 2, blower units 80 are omitted from the drawing for the sake of convenience.

The liquid crystal display assembly 100 according to this embodiment includes:

(a) the liquid crystal display 10; and (b) the surface light source device 60 that illuminates the liquid crystal display from the back surface.

Further, the surface light source device 60 according to this embodiment includes:

(A) a housing 50 including a bottom plate 51;

(B) a light source 40 that is arranged on the bottom plate 51 and illuminates the liquid crystal display 10; and (C) a plurality of radiator fins 53 arranged at a spacing from each other.

Each of the radiator fins 53 includes:

(C-1) a first fin portion 53A formed by bending a part of the bottom plate 51 in a direction away from the liquid crystal display 10, the first fin 53A extending substantially perpendicularly to the bottom plate 51; and (C-2) a second fin portion 53B formed by bending a part of the first fin portion 53A in a direction away from the liquid crystal display 10, the second fin portion 53B extending substantially parallel to the bottom plate 51.

First, the basic configuration and operation of the liquid crystal display assembly 100 including the surface light source device 60 will be described with reference to FIGS. 1A and 1B and FIG. 2.

The liquid crystal display 10 is a transmission type color liquid crystal display, and includes a front panel having a first transparent electrode, a rear panel having a second transparent electrode, and a liquid crystal material arranged between the front panel and the rear panel. Since known components and materials can be used for the various components and the liquid crystal material constituting such a transmission type color liquid crystal display, detailed description thereof is omitted.

The surface light source device 60 is a direct-type surface light source device, and includes the housing 50 and the light source 40. In an embodiment, the housing 50 includes the bottom plate 51 and a side plate 52. The housing 50 is box-shaped with the liquid crystal display 10 side being open. While the bottom plate 51 and the side plate 52 are formed integrally with each other by bending an aluminum plate having a thickness of about 2 mm to thereby the housing 50, the present invention is not limited to this.

In this embodiment, a white light emitting diode is used as the light source 40. The light source 40 is arranged on the bottom plate 51 constituting the housing 50. More specifically, a plurality of the light sources 40 are arranged at a spacing from each other. Further, each light source 40 is arranged at the boundary between the first fin portion 53A and the bottom plate 51. Although all the bottom surfaces (that is, the surfaces on the radiator fin side) of the respective light sources 40 are arranged so as to face the bottom plate, the present invention is not limited to this. While in this embodiment 15×9 (15 per one row in the X direction, and 9 per one row in the Y direction) light sources 40 are arranged at a predetermined spacing (In an embodiment, at a spacing of about 30 mm) in the X direction and the Y direction as shown in FIG. 1A, the present invention is not limited to this. The arrangement spacing of the light sources, the number of light sources, and the like may be set as appropriate in accordance with the specifications of the surface light source device.

In this embodiment, the respective light sources 40 are attached onto a rectangular plate-shaped member 30 made of an aluminum plate having a thickness of about 1 mm, for example, at a spacing of about 30 mm in the X direction and the Y direction. Further, the plate-shaped member 30 is attached onto the bottom plate 51 by means of, for example, a screw, with each light source 40 positioned so as to be arranged at the boundary between the first fin portion 53A and the bottom plate 51. The radiator fins 53, and the positional relation between the radiator fins 53 and the light sources 40 will be described in detail later. While openings 54A are formed in the bottom plate 51 due to the formation of the radiator fins 53 as will be described later, the above-mentioned openings 54A are closed by the plate-shaped member 30. Therefore, there is no unwanted leakage of light to the back surface side of the housing 50 (−Z direction in the drawing).

In this embodiment, a cover 70 surrounding the plurality of radiator fins 53 is arranged so as to face the bottom plate 51. Vent holes 73, 74, and openings 75 for blower unit are formed in the cover. The cover 70 is made of a stainless steel plate having a thickness of about 0.3 mm, for example, and a bottom portion 71 and a side portion 72 of the cover 70 are formed integrally with each other. Further, two openings 75 are formed at the bottom portion of the cover 70. The blower units 80 each formed by a fan, for example, are arranged in the respective openings 75. While in this embodiment the direction of air blow by the blower units 80 is such that air is exhausted from between the cover 70 and the bottom plate 51, the present invention is not limited to this. Further, the blower units 80 may also be arranged between the cover 70 and the bottom plate 51.

While a white light emitting diode is used as each light source 40 in this embodiment, each light source 40 may be formed by a group of light emitting diodes including a red light emitting diode, a green light emitting diode, and a blue light emitting diode. For example, a uniform voltage is applied to each light source 40 from a surface-light-source-device controlling circuit (not shown), and light is emitted. The diffuser plate 20 for diffusing light transmitting through the diffuser plate 20 is arranged between the liquid crystal display 10 and the surface light source device 60. Light emitted from the surface light source device 60 is diffused by the diffuser plate 20 before being radiated to the liquid crystal display 10. To make the radiated light uniform, for example, a white coating may be applied onto the side plate 52 or the plate-shaped member 30. Further, while there is an empty space between the light sources 40 and the diffuser plate 20 in this embodiment, a light guide plate serving as a light guide may be arranged between the light sources 40 and the diffuser plate 20.

It should be noted that the liquid crystal display 10 and the diffuser 20 are retained by a frame (not shown), for example. The diffuser plate 20 is held at a position of about 30 mm from the light sources 40.

Further, the light transmittance of liquid crystal cells constituting the pixels of the liquid crystal display 10 is controlled by a light-crystal-display driving circuit (not shown) in accordance with the brightness of an image to be formed. A predetermined image is displayed by light transmitted through the liquid crystal display 10.

The basic configuration and operation of the liquid crystal display assembly 100 including the surface light source device 60 have been described above. Next, referring to FIG. 3 and FIGS. 4A to 4C, the radiator fins 53 and the positional relation between the radiator fins 53 and the light sources 40 will be described in detail.

FIG. 3 is a schematic perspective view of a part of the housing 50 in which the radiator fins 53 are formed. FIG. 4A is a schematic plan view of a part of the bottom plate 51 of the housing 50. FIG. 4B is a schematic sectional view taken along the direction of the arrow IVB of FIG. 4A. FIG. 4C is a schematic sectional view taken along the direction of the arrow IVC of FIG. 4A.

As shown in FIG. 3 and FIGS. 4A to 4C, the plurality of radiator fins 53 are formed in the housing 50 by bending a part of the bottom plate 51 constituting the housing 50. Each of the radiator fins 53 includes the first fin portion 53A and the second fin portion 53B. In this embodiment, the first fin portion 53A constituting each radiator fin 53 is arranged along the Y direction in the drawing, and has a width of about 40 mm in the Y direction. The respective radiator fins 53 are arranged at a spacing from each other. More specifically, the first fin portion 53A and the adjacent first fin portion 53A are arranged at a spacing of about 28 mm in the X direction. Further, the first fin portion 53A and the adjacent first fin portion 53A are arranged at a spacing of about 20 mm in the Y direction.

The first fin portion 53A is formed by bending a part of the bottom plate 51 in a direction away from the liquid crystal display 10 (in other words, in a direction away from the light sources 40). The first fin portion 53A extends substantially perpendicularly to the bottom plate 51. It should be noted that the openings 54A each corresponding to the first fin portion 53A are formed in the bottom plate 51. While the width of the first fin portion 53A in the Z direction is set as about 15 mm in this embodiment, the present invention is not limited to this.

The second fin portion 53B is formed by bending a part of the first fin portion 53A in a direction away from the liquid crystal display 10 (in other words, in a direction away from the light sources 40). The second fin portion 53B extends substantially parallel to the bottom plate 51. In this embodiment, the second fin portion 53B is formed by bending the central portion of the first fin portion 53A. The second fin portion 53B is bent so as to extend in the +X direction in the drawing. It should be noted that openings 54B each corresponding to the second fin portion 53B are formed in the bottom plate 51. While the widths of the second fin portion 53B in the Y direction and the X direction are respectively set as about 20 mm and about 10 mm in this embodiment, the present invention is not limited to this.

Each light source 40 is arranged at the boundary between the first fin portion 53A and the bottom plate 51. More specifically, as shown in FIGS. 4A to 4C, two light sources 40 are arranged in each radiator fin 53, and each of the light sources 40 is arranged at a position corresponding to the boundary between the leg portion of the first fin portion 53A and the bottom plate 51. Since each light source 40 is arranged in correspondence with the leg portion of the first fin portion 53A, heat generated by the light sources 40 can be efficiently transmitted to the radiator fins 53.

According to the above-described configuration, the radiator fins 53 are formed integrally with the bottom plate 51 constituting the housing 50. Therefore, there is no need to attach the radiator fins 53 to the bottom plate 51 as independent components. Since the second fin portion 53B is formed by being bent in a direction away from the light sources 40 that are the heat generation sources, the second fin portion 53B is arranged on the lower temperature side, thereby achieving an improvement in cooling efficiency. Further, the opening 54B corresponding to the second fin portion 53B is formed in the first fin portion 53A. Since the radiator fins 53 are arranged at a spacing from each other, and the above-described opening 54B is formed in the first fin portion 53A, in each of the radiator fins 53, a passage for air is secured in both a direction parallel to the first fin portion 53A (Y direction in the drawing), and a direction perpendicular to the first fin portion 53A (X direction in the drawing), so the heat of the radiator fin 53 is effectively discharged. Favorable heat radiation characteristics can be thus obtained at low cost.

The liquid crystal display assembly 100 and the surface light source device 60 have been described above. Now, a brief description will be given of modifications of the radiator fins 53.

A first modification will be described with reference to FIGS. 5A to 5C. FIG. 5A is a schematic plan view of a part of the bottom plate 51 of the housing 50 according to the first modification. FIG. 5B is a schematic sectional view taken along the direction of the arrow VB of FIG. 5A. FIG. 5C is a schematic sectional view taken along the direction of the arrow VC of FIG. 5A. The same applies to the drawings of other modifications that will be described later. The first modification differs from the configuration shown in FIGS. 4A to 4B in that the second fin portion 53B is bent as so to extend in the −X direction in the drawing.

Figure 6A:
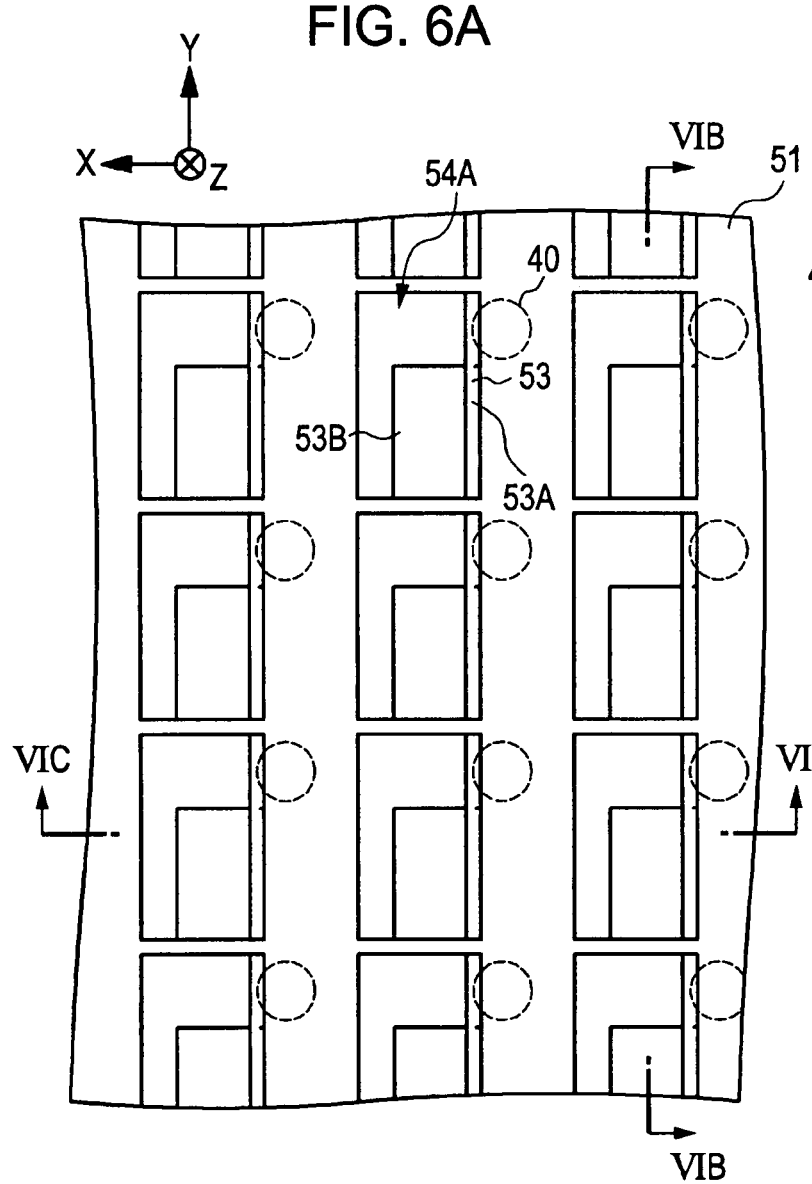
FIG. 6A is a schematic plan view of a part of a bottom plate of a housing according to a second modification.
Figure 6B:
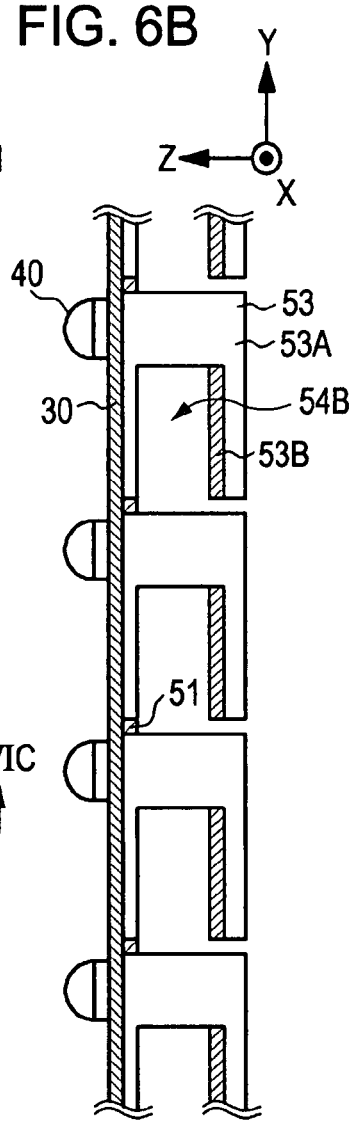
FIG. 6B is a schematic sectional view taken along the direction of the arrow VIB of FIG. 6A.
Figure 6C:
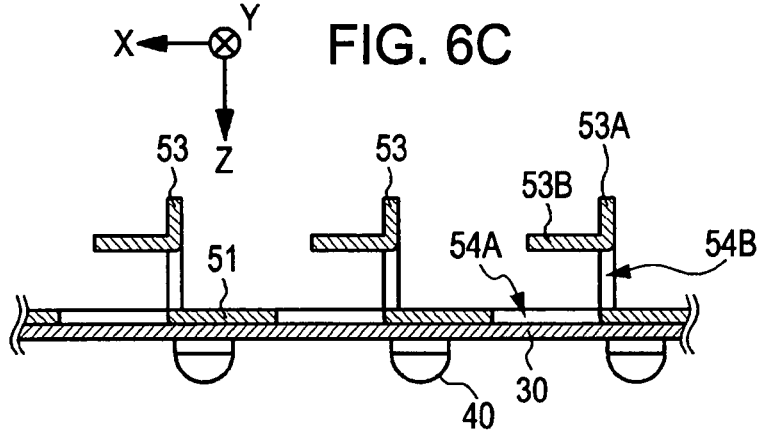
FIG. 6C is a schematic sectional view taken along the direction of the arrow VIC of FIG. 6A.

A second modification will be described with reference to FIGS. 6A to 6C. According to the second modification, one radiator fin 53 is provided in correspondence with each light source 40. The second fin portion 53B is formed by bending a part of one side (−Y direction side) of the first fin portion 53A.

A third modification will be described with reference to FIGS. 7A to 7C. The third modification differs from the configuration shown in FIGS. 6A to 6B in that a plurality of second fin portions 53B are formed in each radiator fin 53. Specifically, the first fin portion 53A is substantially T-shaped, and the respective second fin portions 53B are formed so as to be symmetrical with the leg portion of the first fin portion therebetween. According to the third modification, the distance of the path from the light source 40 to the second fin portion 53B (more specifically, the distance of the path in which heat generated by the light source 40 is transmitted through the first fin portion 53A to the second fin portion 53B) can be made smaller than that in the second modification. Therefore, heat generated by the light source 40 can be transmitted to the second fin portion 53B with greater efficiency.

A fourth modification will be described with reference to FIGS. 8A to 8C. According to the fourth modification, three light sources 40 are arranged in correspondence with each radiator fin 53. In the embodiment shown in FIG. 4, one second fin portion 53B is provided in correspondence with two light sources 40. On the other hand, in the fourth modification shown in FIGS. 8A to 8C, two second fin portions 53B are provided in correspondence with three light sources 40. Further, the surface area of the first fin portion 53B becomes larger than that in the embodiment shown in FIG. 4. Therefore, according to the fourth modification, the surface area of the radiator fin 53 corresponding to each light source 40 is large as compared with the embodiment shown in FIG. 4, thereby achieving a further improvement in cooling efficiency.

A fifth modification will be described with reference to FIGS. 9A to 9C. The fifth modification is an extension of the fourth embodiment. In the fifth modification, the respective radiator fins 53 are formed continuously in the Y direction. For the same reason as described above with reference to the fourth modification, the surface area of the radiator fin 53 corresponding to each light source 40 becomes large, thereby achieving an improvement in cooling efficiency.

While the present invention has been described above by way of its embodiments, the present invention is not limited to these embodiments. The configuration and structure of the liquid crystal display assembly, surface light source device, liquid crystal display, light sources, and the like described in the above embodiments are merely exemplary, and can be changed as appropriate.

While in the embodiments and the like the first fin portion 53A constituting each radiator fin 53 is arranged along the Y direction, the present invention is not limited to this. Further, it is not necessarily required that all of the radiator fins 53 (more specifically, the first fin portions 53A constituting the radiator fins 53) be arranged along the same direction. For example, the radiator fins 53 may be arranged in a staggered fashion. The same applies to the arrangement of the light sources 40.

In the embodiments, each light source is made of a light emitting diode (LED). Usually, there is some degree of variation in light emission efficiency between light emitting diodes. Further, usually, the light emission efficiency of a light emitting diode tends to decrease with increasing temperature. Further, it is difficult to keep the entire surface light source device at a strictly uniform temperature, and hence there is some degree of variation in temperature distribution due to design requirements. Accordingly, by grouping light emitting diodes (LEDs) on the basis of light emission efficiency in advance, arranging light emitting diodes (LED) of high light emission efficiency in the areas of the surface light source device where the temperature is high due to design requirements, and arranging light emitting diodes (LEDs) of low light emission efficiency in the areas of the surface light source device where the temperature is low due to design requirements, it is possible to achieve an improvement in the uniformity of the luminance of the surface light source device.

What is claimed is:

1. A liquid crystal display assembly, comprising:
a liquid crystal display; and
a surface light source device that illuminates the liquid crystal display from a back surface,
wherein the surface light source device includes
a housing including a bottom plate,
a light source that is arranged on the bottom plate and illuminates the liquid crystal display, and
a plurality of radiator fins arranged at a spacing from each other, and
wherein each of the radiator fins includes
a first fin portion formed by bending a part of the bottom plate in a direction away from the liquid crystal display, the first fin portion extending substantially perpendicularly to the bottom plate, and
a second fin portion formed by bending a part of the first fin portion in a direction away from the liquid crystal display, the second fin portion extending substantially parallel to the bottom plate;
wherein a cover surrounding the plurality of radiator fins is arranged so as to face the bottom plate, a vent hole and a blower-means opening are formed in the cover, and blower means is arranged in the opening.

2. The liquid crystal display assembly according to claim 1, wherein a plurality of the light sources are arranged at a spacing from each other, and each of the light sources is arranged at the boundary between the first fin portion and the bottom plate.

3. A surface light source device that illuminates the liquid crystal display from a back surface, comprising:
- a housing including a bottom plate;
- a light source that is arranged on the bottom plate and illuminates the liquid crystal display; and
- a plurality of radiator fins arranged at a spacing from each other,
- wherein each of the radiator fins includes
- a first fin portion formed by bending a part of the bottom plate in a direction away from the liquid crystal display, the first fin portion extending substantially perpendicularly to the bottom plate, and
- a second fin portion formed by bending a part of the first fin portion in a direction away from the liquid crystal display, the second fin portion extending substantially parallel to the bottom plate;
- wherein a cover surrounding the plurality of radiator fins is arranged so as to face the bottom plate, a vent hole and a blower-means opening are formed in the cover, and blower means is arranged in the opening.

4. The surface light source device according to claim 3, wherein a plurality of the light sources are arranged at a spacing from each other, and each of the light sources is arranged at the boundary between the first fin portion and the bottom plate.

* * * * *